US012596152B2

(12) United States Patent
Guibene et al.

(10) Patent No.: US 12,596,152 B2
(45) Date of Patent: *Apr. 7, 2026

(54) INTERNET OF THINGS BATTERY DEVICE

(71) Applicant: Tahoe Research, Ltd., Dublin (IE)

(72) Inventors: Wael Guibene, Leixlip (IE); John Brady, Celbridge (IE); Keith Nolan, Mullingar (IE); Mark Kelly, Dublin (IE); Cliodhna Ni Scanaill, Broadford (IE)

(73) Assignee: Tahoe Research, Ltd., Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 18/433,058

(22) Filed: Feb. 5, 2024

(65) Prior Publication Data

US 2024/0175928 A1      May 30, 2024

Related U.S. Application Data

(63) Continuation of application No. 18/158,905, filed on Jan. 24, 2023, now Pat. No. 11,892,512, which is a continuation of application No. 17/107,166, filed on Nov. 30, 2020, now Pat. No. 11,567,136, which is a
(Continued)

(51) Int. Cl.
| | |
|---|---|
| *G01R 31/371* | (2019.01) |
| *G01R 31/382* | (2019.01) |
| *H02J 7/00* | (2006.01) |
| *H02J 50/10* | (2016.01) |
| *H02J 50/80* | (2016.01) |

(52) U.S. Cl.
CPC ......... *G01R 31/371* (2019.01); *G01R 31/382* (2019.01); *H02J 7/0048* (2020.01); *H02J 7/005* (2020.01); *H02J 50/10* (2016.02); *H02J 50/80* (2016.02)

(58) Field of Classification Search
None
See application file for complete search history.

(56) References Cited

U.S. PATENT DOCUMENTS

| | | | |
|---|---|---|---|
| 4,731,603 A | 3/1988 | McRae | |
| 5,327,144 A | 7/1994 | Stilp | |
| 5,955,869 A | 9/1999 | Rathmann | |
(Continued)

FOREIGN PATENT DOCUMENTS

| | | | |
|---|---|---|---|
| KR | 2011-0122633 A | 11/2011 | |
| WO | 2010/006307 A1 | 1/2010 | |
| WO | 2017/172089 A1 | 10/2017 | |

OTHER PUBLICATIONS

"U.S. Appl. No. 15/088,879, Notice of Allowance mailed Jul. 30, 2020", 9 pgs.
(Continued)

*Primary Examiner* — John F Mortell
(74) *Attorney, Agent, or Firm* — Studebaker Brackett PLLC

(57) ABSTRACT
A method and apparatus for monitoring an internet-of-things (IoT) battery device (IBD). An example IBD includes a radio transceiver to communicate with an IoT charging device (ICD), a battery, and a battery monitor to determine a state of charge for the battery. An alerter is included to send an alert message to the ICD, via the radio transceiver, to indicate that the SoCh is less than an alert threshold.

20 Claims, 12 Drawing Sheets

Related U.S. Application Data continuation of application No. 15/088,879, filed on Apr. 1, 2016, now Pat. No. 10,855,098.

(56) References Cited

U.S. PATENT DOCUMENTS

| | | | |
|---|---|---|---|
| 6,323,775 | B1 | 11/2001 | Hansson |
| 8,310,201 | B1 | 11/2012 | Wright |
| 9,748,782 | B1 | 8/2017 | Sheng et al. |
| 10,855,098 | B2 | 12/2020 | Guibene et al. |
| 2002/0123850 | A1 | 9/2002 | Miyoshi et al. |
| 2008/0009984 | A1 | 1/2008 | Lee et al. |
| 2009/0027271 | A1 | 1/2009 | Banker |
| 2009/0033277 | A1 | 2/2009 | Ludtke |
| 2011/0298626 | A1 | 12/2011 | Fechalos et al. |
| 2013/0257365 | A1 | 10/2013 | Redding |
| 2014/0266695 | A1 | 9/2014 | Addison et al. |
| 2015/0038197 | A1* | 2/2015 | Skipper .............. H04W 52/0251 455/573 |
| 2015/0042480 | A1 | 2/2015 | Tan et al. |
| 2015/0046106 | A1* | 2/2015 | Wade ........................ H04Q 9/00 702/63 |
| 2016/0133255 | A1 | 5/2016 | Haiut |
| 2017/0083073 | A1 | 3/2017 | Chakra |
| 2017/0288447 | A1 | 10/2017 | Guibene et al. |

OTHER PUBLICATIONS

"U.S. Appl. No. 15/088,879, Non Final Office Action mailed Apr. 15, 2020", 23 pages.
"U.S. Appl. No. 15/088,879, Response filed Jul. 15, 2020 to Non Final Office Action mailed Apr. 15, 2020", 21 pgs.
"International Application Serial No. PCT US2017 017967, International Search Report mailed May 11, 2017", 4 pgs.
"International Application Serial No. PCT US2017 017967, Written Opinion mailed May 11, 2017", 12 pgs.
"International Application Serial No. PCT US2017 017967, International Preliminary Report on Patentability mailed Oct. 11, 2018", 14 pgs.
"U.S. Appl. No. 15/088,879, Restriction Requirement mailed Feb. 27, 2018", 6 pgs.
"U.S. Appl. No. 15/088,879, Response filed Apr. 27, 2018 to Restriction Requirement mailed Feb. 27, 2018", 2 pgs.
"U.S. Appl. No. 15/088,879, Examiner Interview Summary mailed May 2, 2018", 2 pgs.
"U.S. Appl. No. 15/088,879, Non Final Office Action mailed Jun. 20, 2019", 21 pgs.
"U.S. Appl. No. 15/088,879, Response filed Oct. 21, 2019 to Non Final Office Action mailed Jun. 20, 2019", 24 pgs.
"U.S. Appl. No. 15/088,879, Final Office Action mailed Oct. 31, 2019", 22 pgs.
"U.S. Appl. No. 15/088,879, Response filed Mar. 2, 2020 to Final Office Action mailed Oct. 31, 2019", 13 pgs.

* cited by examiner

400

500

700

Start

902 — Initiate Communications with the ICDs

904 — Connected?    N

Y

906 — Determine State of Charge (SoCh)

908 — Determine State of Health (SoH)

910 — Determine State of Function (SoF)

912 — Perform Analysis of Battery Metrics

914 — Metric Greater than the Alert Threshold?    N

Y

916 — Send Alarm to ICDs

918 — Unmount Battery

End

900

INTERNET OF THINGS BATTERY DEVICE

CROSS-REFERENCE TO RELATED APPLICATIONS PRIORITY APPLICATION

This application is a Continuation of U.S. patent application Ser. No. 18/158,905, filed Jan. 24, 2023, which is a Continuation of U.S. patent application Ser. No. 17/107,166, filed Nov. 30, 2020, which is a Continuation of U.S. patent application Ser. No. 15/088,879, filed Apr. 1, 2016, the entire contents of which are incorporated herein by reference.

TECHNICAL FIELD

The present techniques relate generally to Internet of Things (IOT) devices. More specifically the present techniques relate to devices that can monitor and charge IoT batteries.

BACKGROUND

It has been estimated that the Internet of Things (IOT) may bring Internet connectivity to 50 billion devices by 2020. For organizations, IoT devices may provide opportunities for monitoring and tracking other devices and items, including IoT devices and other devices. As the number of these devices increases, the use of techniques to track and monitor the devices will become more important. Further, it is envisaged that a significant portion of the number of the IoT devices will be battery powered devices.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1A:
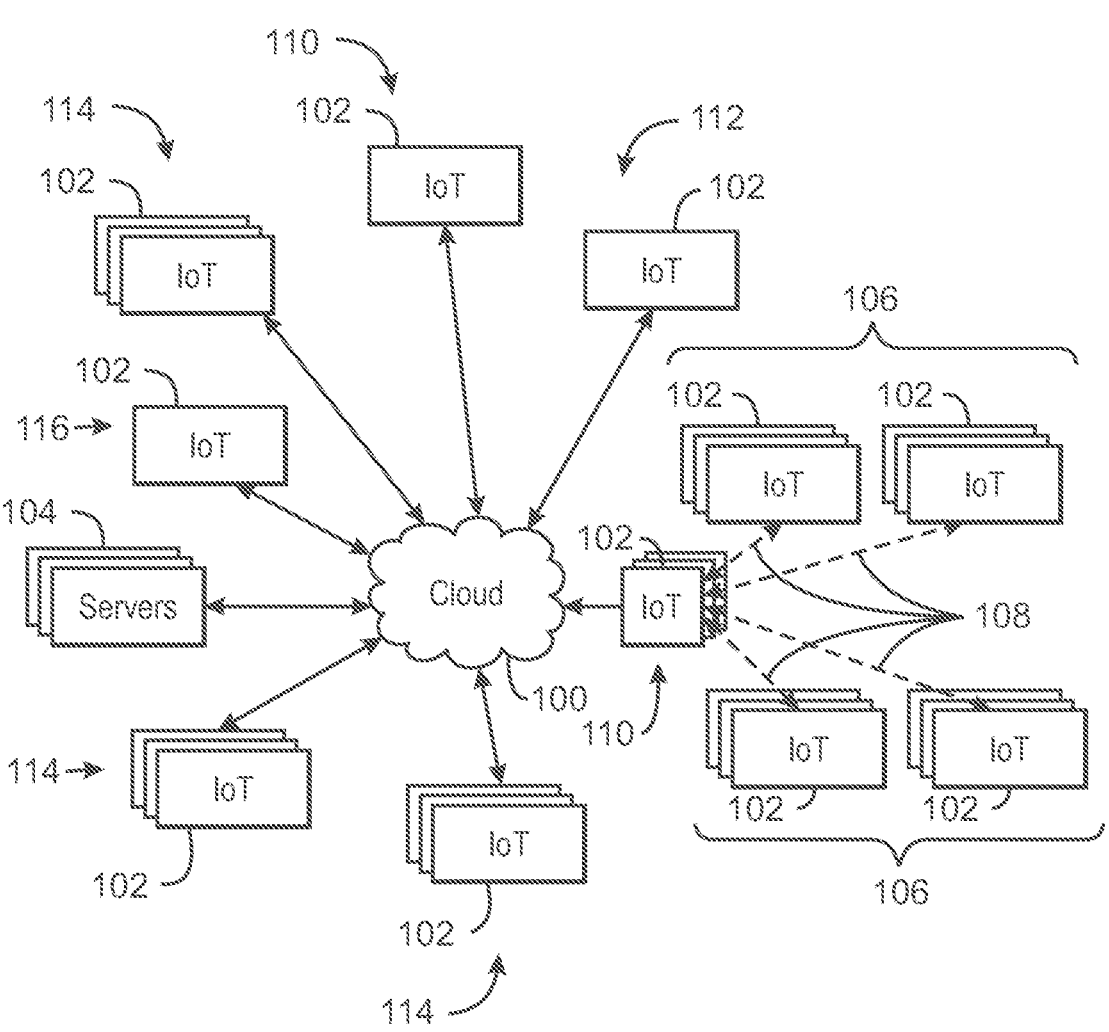
FIG. 1A is a drawing of a cloud computing network, or cloud, in communication with a number of Internet of Things (IoT) devices, at least some of which are IBDs communicating with ICDs.

The internet of things (IoT) is a concept in which a large number of computing devices are interconnected to each other and to the Internet to provide functionality and data acquisition at very low levels. For example, IoT networks may include commercial and home automation devices, such as water distribution systems, electric power distribution systems, pipeline control systems, plant control systems, light switches, thermostats, locks, cameras, alarms, motion sensors, and the like. These devices, termed IoT devices herein, may be accessible through remote computers, servers, and other systems, for example, to control systems or access data. Further IoT devices may include IoT gateways, used to couple other IoT devices to cloud applications.

As described herein, an IoT battery device may be used to track a location of an object, and to activate an alert when the battery power has reached a level indicating that the battery should be recharged. This invention enhances the role of batteries from just power delivery components to an active connected subsystem of the IoT system capable of remotely monitoring its state of charge (SoCh), state of health (SoH) and state of function (SoF).

The SoCh is a value that represents the remaining capacity of the battery, measured by monitoring a voltage output from the battery, taken as a percentage between a maximum voltage output and a functional minimum voltage output. This may be considered as the point at which the battery may fail to power a device, along the discharge curve.

The SoH is a value that represents the capacity of the battery, e.g., the amount of energy a battery is capable of delivering. Over multiple charge-discharge cycle the capacity degrades. The SoH may be estimated by monitoring the charge/discharge cycles of the battery.

The SoF is a value that incorporates the SoCh and SoH of the battery to provide a single operational number. The SoF predicts the ability of the battery to provide sufficient power to maintain operation.

Further, the techniques described herein provide for the localization and ranging of the devices. This may be utilized even when the devices are not themselves battery powered.

The techniques include two types of devices, the first of which is a battery form-factor device that may integrate a low-power microcontroller unit (MCU), and a radio transceiver, for example, compatible with the low power-wide area (LPWA) standard promulgated by the GSMA as part of the "Mobile IoT Initiative." The LPWA allows low bit rate machine to machine (M2M) communications over long distances, as discussed herein. The battery device, termed an IoT battery device or IBD herein, may also include an inductive power transfer receiver. The second device is a wireless charging station, termed an IoT charging device or ICD herein, is capable of communicating with the IBDs and determining their location. Further, the ICD may be used to recharge the batteries in the IBDs, either wirelessly, or by a wired connection.

The devices enable the power supplies for existing battery powered devices to be monitored remotely, and may allow these devices to become wirelessly rechargeable devices. When an IBD reports a battery needs recharging, the ICDs can locate the device and report the issue and location to a user. When reporting the issue and location, the network of ICDs may also inform the user of the location of a recharged IBD, for example, in case a closest ICD does not currently have one. The user may then carry a charged IBD to the field to replace the depleted IBD, and return the depleted device to the nearest ICD for recharging. In some examples, the user may drive a vehicle powered by an IBD to the ICD for charging or move the ICD to the IBD for charging.

The system addresses the problem of remote monitoring of battery levels and status in battery-powered IoT devices. This may be especially useful for IoT devices in remote or inaccessible locations, such as embedded sensors in equipment, underground sensors, sensors mounted in walls and ceilings, remote environmental monitoring devices, and energy storage units, such as electric vehicles. Further, monitoring the location of unpowered devices may also be important. Such devices may include assets managed by cities, hospitals, companies, or individuals such as gas canisters, rubbish containers and the like.

FIG. 1A is a drawing of a cloud computing network, or cloud 100, in communication with a number of Internet of Things (IoT) devices, at least some of which are IBDs communicating with ICDs. The cloud 100 may represent the Internet, or may be a wide area network, such as a proprietary network for a company. The IoT devices 102 may include any number of different types of devices, grouped in various combinations. For example, an IBD group 106 may include IoT devices 102 that may be tracking and powering other devices. These IoT devices 102 may include remote weather stations, integrated sensors, temperature sensors, security sensors, traffic flow monitors, cameras, and any number of other devices. The IoT devices 102 may be communicating through the cloud 100 with a server 104 that provides information to a user, for example, to inform them that an IBD needs servicing, the location of the unit holding the IBD, and the location of a nearest recharged IBD.

The IoT battery devices in the IBD group 106 may be in communication with the cloud 100 through a sub-network 108, such as a local radio frequency network provided by a group of ICDs 110. The ICDs 110 may determine the battery status and, working as a group, the locations of each of the IoT devices 102 in the IBD group 106. This may occur when an IBD reports a low charge or a battery fault, or may occur when a user queries the location of an IBD.

Other IoT devices 102 may include remote weather stations 111, local information terminals 112, alarm system sensors 114, and alarm panels 116, among many others. Each of these IoT devices 102 may be in communication with other IoT devices 102, with servers 104, or both. Further, many of these IoT devices 102 may be included in an IBD group 106 to track location, battery status, or both.

Figure 1B:
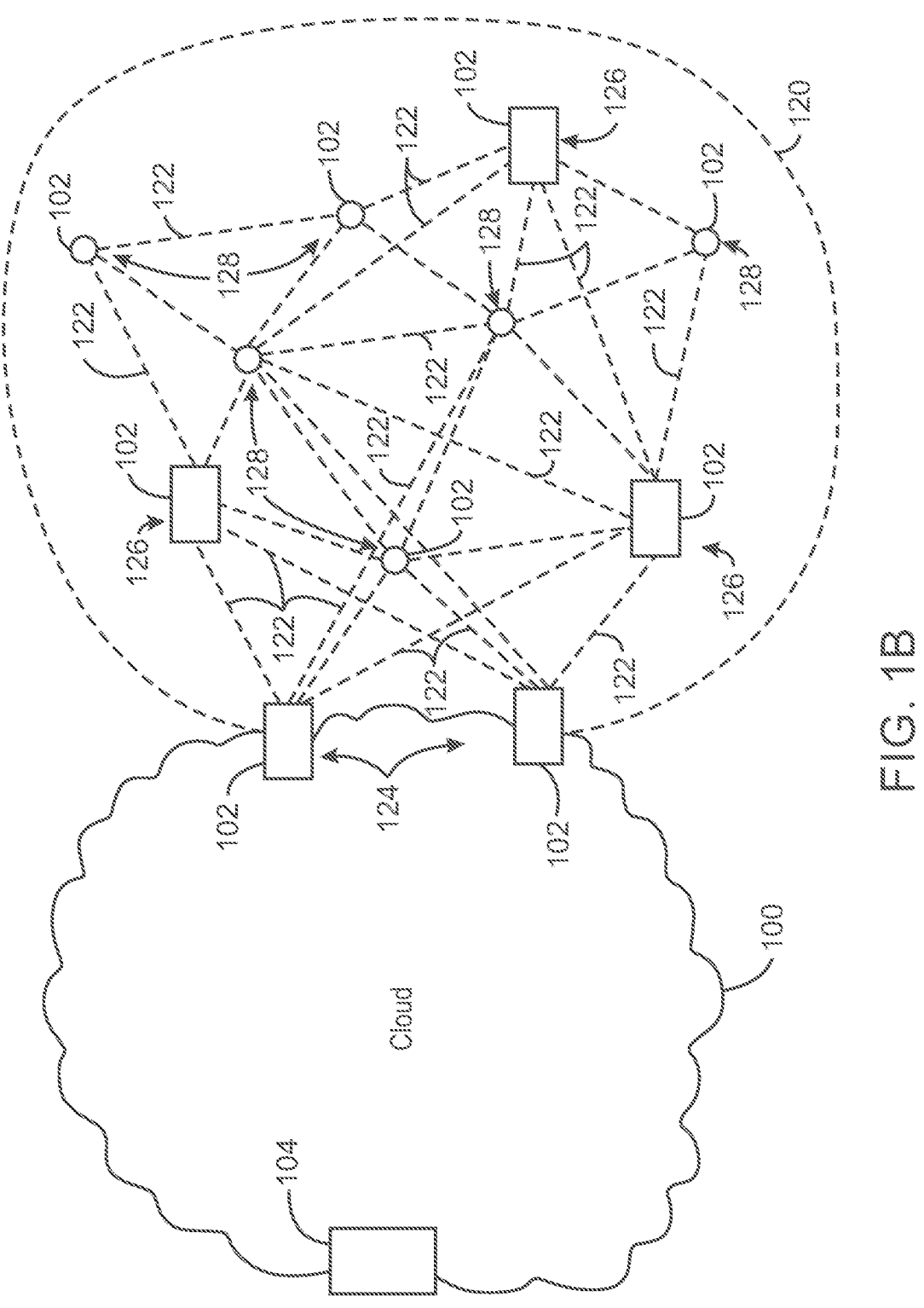
FIG. 1B is a drawing of a cloud computing network, or cloud, in communication with a mesh network of IoT devices, which may be termed a fog, operating at the edge of the cloud.

FIG. 1B is a drawing of a cloud computing network, or cloud 100, in communication with a mesh network of IoT devices 102, which may be termed a fog 120, operating at the edge of the cloud 100. To simplify the diagram, not every IoT devices 102 is labeled.

The fog 120 may be considered to be a massively interconnected network wherein a number of IoT devices 102 are in communications with each other, for example, by radio links 122. This may be performed using the open interconnect consortium (OIC) standard specification 1.0 released by the Open Connectivity Foundation™ (OCF) on Dec. 23, 2015. This standard allows devices to discover each other and establish communications for interconnects. Other interconnection protocols may also be used, including, for example, the optimized link state routing (OLSR) Protocol, or the better approach to mobile ad-hoc networking (B.A.T.-.M.A.N.), among others.

Three types of IoT devices 102 are shown in this example, gateway/ICDs 124, ICDs 126, and IBDs 128, although any combinations of IoT devices 102 and functionality may be used. The gateway/ICDs 124 may be edge devices that provide communications between the cloud 100 and the fog 120, and may also function as charging and locating devices for the IBDs 128. The ICDs 126 may provide charging for IBDs 128 and may also locate the IBDs 128. The locations, charging alerts, battery alerts, and other data, or both may be passed along to the cloud 100 through the gateway/ICDs 124. As described herein, the IBDs 128 may provide power, location services, or both to other devices or items.

Communications from any IoT device 102 may be passed along the most convenient path between any of the IoT devices 102 to reach the gateways 124. In these networks, the number of interconnections provide substantial redundancy, allowing communications to be maintained, even with the loss of a number of IoT devices 102.

The fog 120 of these IoT devices 102 devices may be presented to devices in the cloud 100, such as a server 104, as a single device located at the edge of the cloud 100, e.g., a fog 120 device. In this example, the alerts coming from the fog 120 device may be sent without being identified as coming from a specific IoT device 102 within the fog 120. For example, an alert may indicate that an IBD 128 needs to be returned for charging and the location of the IBD 128, without identifying any specific ICD 126 that sent the alert.

In some examples, the IoT devices 102 may be configured using an imperative programming style, e.g., with each IoT device 102 having a specific function. However, the IoT devices 102 forming the fog 120 device may be configured in a declarative programming style, allowing the IoT devices 102 to reconfigure their operations and determine needed resources in response to conditions, queries, and device failures. For example, a query from a user located at a server 104 about the location of an IBD 128 may result in the fog 120 device selecting the IoT devices 102, such as particular gateways 124, ICDs 126 or IBDs 128, needed to answer the query.

If the IBDs 128 are providing power to a device, sensors associated with the IBD 128, such as power demand, temperature, and the like, may be used in concert with sensors on the device, or other devices, to answer a query. In this example, IoT devices 102 in the fog 120 may select the sensors on particular IBDs 128 based on the query, such as adding data from power sensors or temperature sensors. Further, if some of the IoT devices 102 are not operational, for example, if an ICD 126 has failed, other IoT devices 102 in the fog 120 device may provide substitute, allowing locations to be determined.

Figure 2:
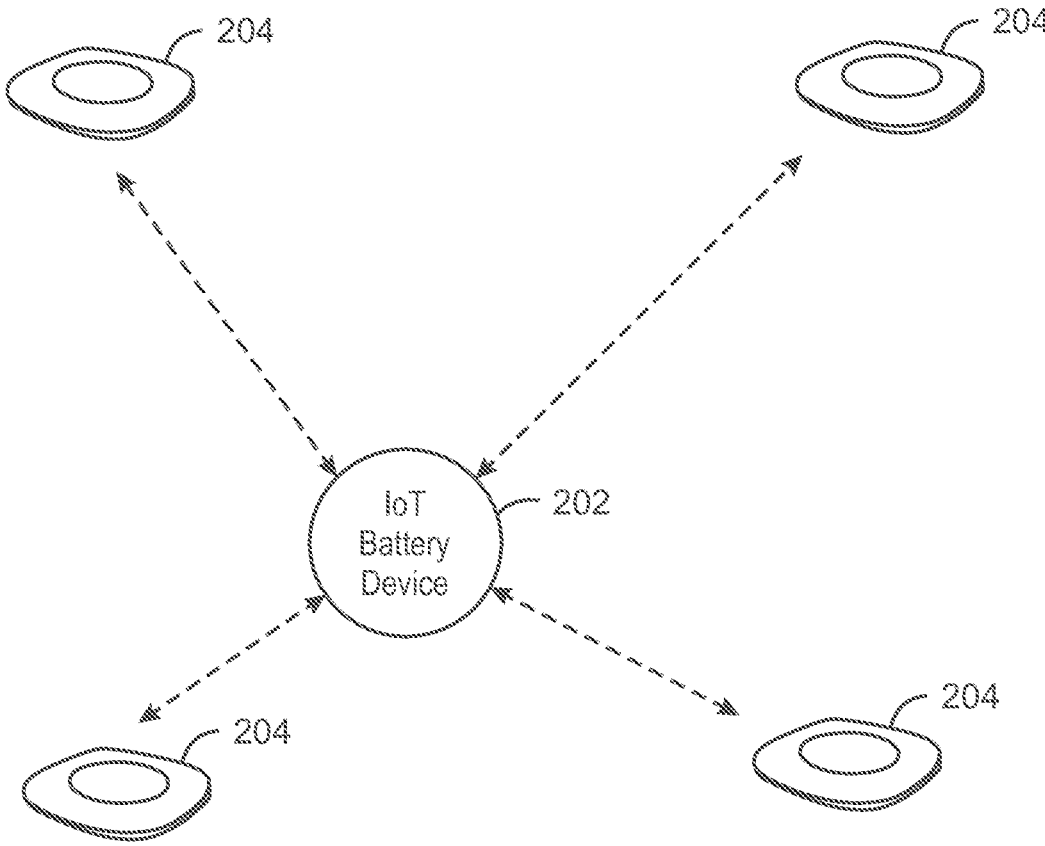
FIG. 2 is a schematic diagram of an IBD in communications with a number of ICDs.

Further, the fog 120 may divide itself into smaller units based on the relative physical locations of the IBDs 128 and ICDs 126, as discussed with respect to FIG. 2. In this example, the communications for an IBD 128 that has been instantiated in one portion of the fog 120 may be passed along to IoT devices 102 along the path of movement of the IBD 128. Further, if the IBD 128 is moved from one location to another location that is in a different region of the fog 120, different ICDs 126 may be identified as charging stations for the IBD 128.

As an example, if an IBD 128 is used to power a portable device in a chemical plant, such as a personal hydrocarbon detector, the device will be moved from an initial location, such as a stockroom or control room, to locations in the chemical plant, which may be a few hundred feet to several thousands of feet from the initial location. If the entire facility is included in a single fog 120 charging structure, as the device moves, data may be exchanged between ICDs 126 that includes the alert and location functions for the IBD 128, e.g., the instantiation information for the IBD 128. Thus, if a battery alert for the IBD 128 indicates that it needs to be charged, the fog 120 may indicate a closest ICD 126 that has a fully charged IBD 128 ready for exchange with the IBD 128 in the portable device.

FIG. 2 is a schematic diagram 200 of an IBD 202 in communications with a number of ICDs 204. As described further with respect to FIGS. 4 and 5, the IBD 202 may include an LPWA, or other, low power transceiver, a small MCU, a rechargeable battery integrated into an enclosure having a battery form factor. The IBD 202 may also include a wireless power receiver circuit for wireless charging. Although only one IBD 202 is shown in the schematic diagram 200, multiple IBDs may be used with the ICDs 204.

Figure 6:
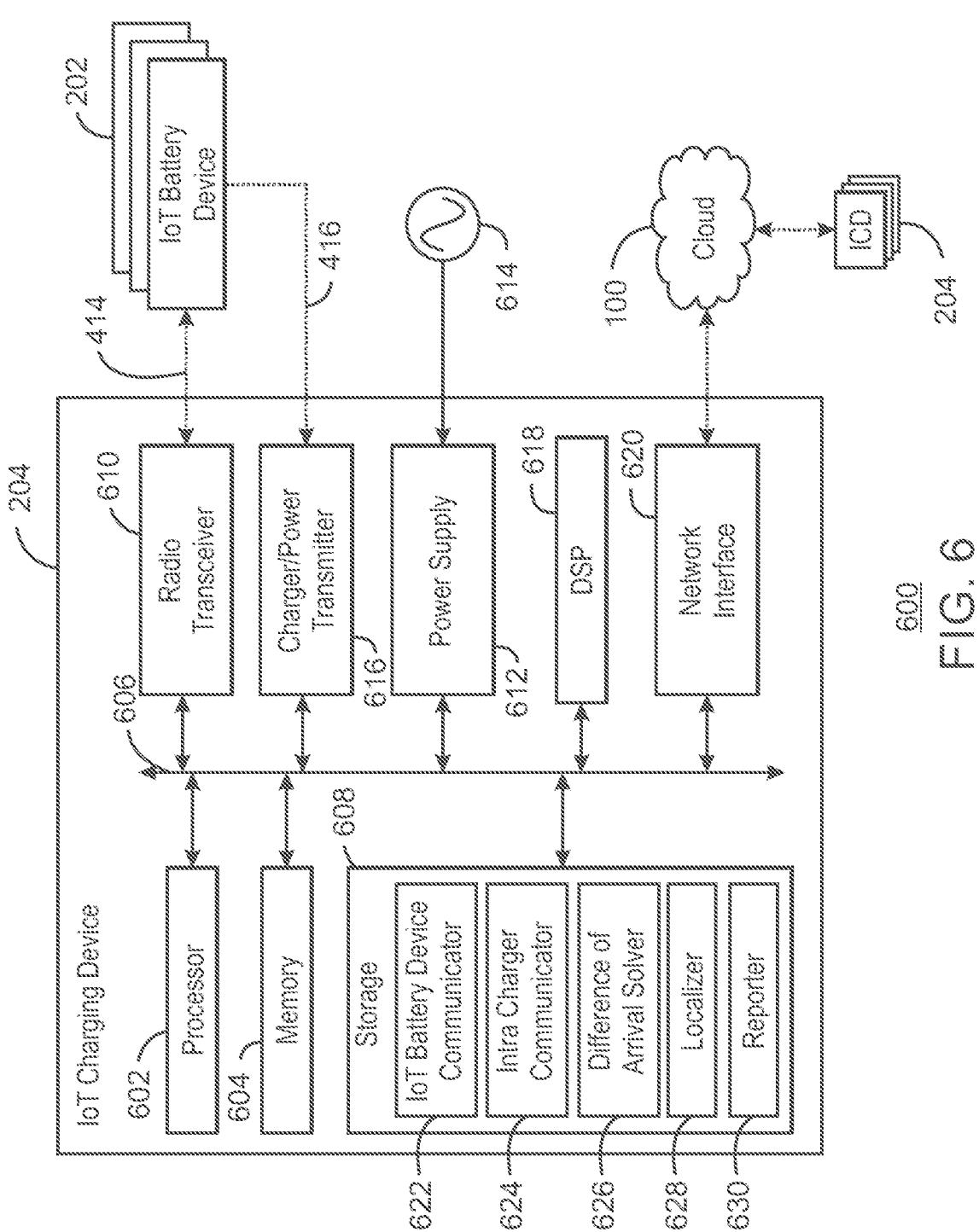
FIG. 6 is a block diagram of an example of components that may be present in an ICD.
Figure 7:
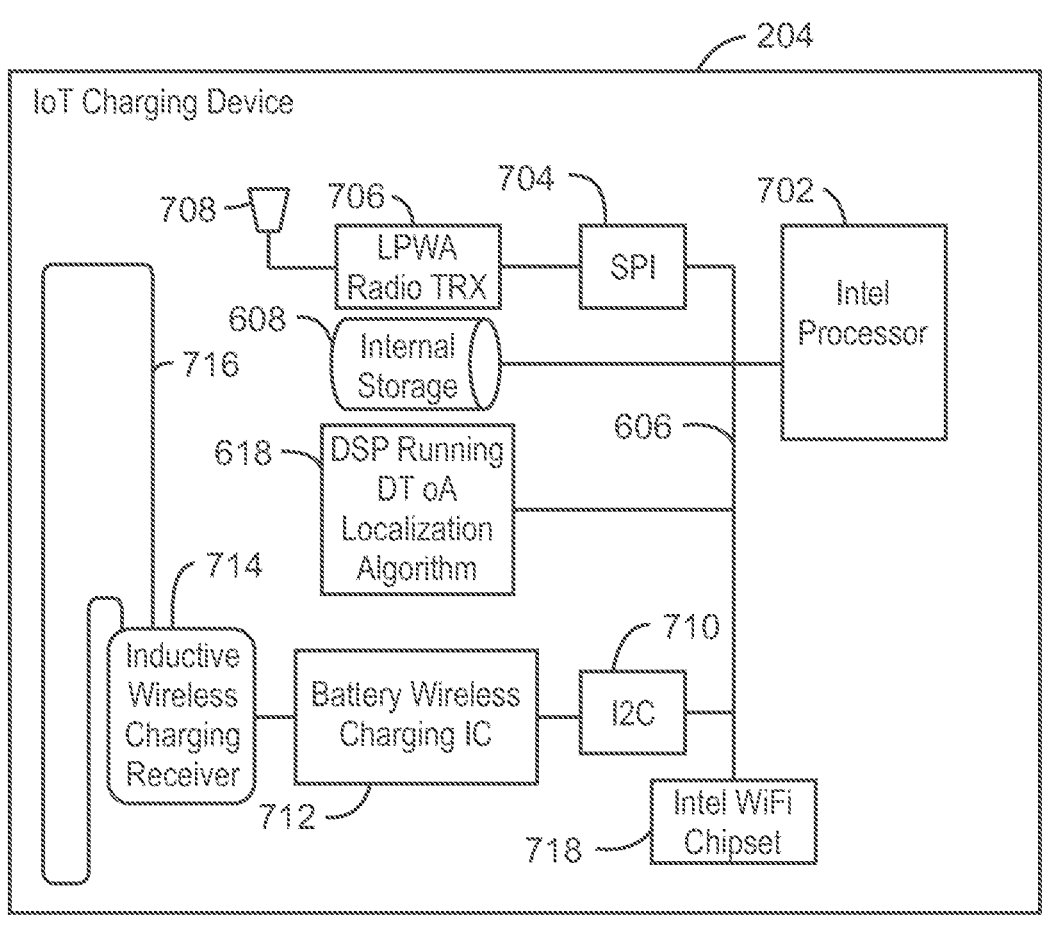
FIG. 7 is block diagram of an example of an ICD.

As described further with respect to FIGS. 6 and 7, the ICDs 204 may include a compatible transceiver to communicate with the IBD 202, a processor, and a network gateway to communicate with other ICDs 204 and a server. The ICDs 204 may also include an integrated wireless power transmitter circuit to charge an IBD 202. The ICD 204 may act as a gateway for the messages transmitted from the IBD 202, and may also be used as a wireless charging station for the IBD 202. In some example, the ICDs 204 have multiple charging circuits to enable them to charge and maintain multiple IBDs 202 for immediate access.

During normal operation, the IBD 202 may periodically transmit a current state of charge (SoCh) to the ICDs 204. This facilitates remote monitoring of the SoCh and enables device localization. When the SoCh of the batteries reach a minimum threshold, or if other problems are detected with the battery, an alert may be sent to a user, and the battery may be recharged by an ICD 204, for example, by placing them in close proximity to the ICD 204 for wireless recharging.

Using low power wide area (LPWA) radio transceivers, the communications between the IBD 202 and the ICDs 204 may extend to as much as to 2 kilometers indoors or as much as 25 kilometers outdoors. By comparison, Bluetooth low energy (BTLE) may be limited to 80 meters. Thus, this may provide an improvement of 2400% in range over BTLE based solutions. Further, the transceiver may be selected to operate in multiple frequency bands, e.g., 868 MHz in ITU Region 1, 915 MHz in ITU Region 2 and/or 2.4 GHz ISM bands globally, to decrease interference from other transceivers.

While the configuration shown in FIG. 2 may allow for a fixed area of coverage, with all of the ICDs 204 communicating with all of the IBDs 202, the examples described are not limited to this fixed configuration. The use of composable devices, e.g., individual IoT devices 102 that can self-select participation to form virtual devices, may allow the charging system to be larger, more transparent, and more redundant than fixed configurations.

For example, returning to FIG. 1B, the fog 120 may allow the IoT devices 102 described herein to reconfigure or compose themselves into different groups or virtual devices to monitor locations of target IBDs 128 across a massive network of interconnected devices. Thus, any four of the IoT devices 102 that includes at least one target IBD 128 may reconfigure themselves to form a virtual device, termed a IBD 128 location and battery monitoring device (LBMD) herein, to communicate with the target IBD 128. Depending on the configuration, the LBMD may also monitor the status and location of the target IBD 128.

In the LBMD, the target IBD 128 is in communication with any three other IoT devices 102, including gateways 124, ICDs 126, and other IBDs 128, among other devices. The timestamp on the communications received from the target IBD 128 at each of the three IoT devices 102 may be used to locate the target IBD 128. If one of the IoT devices 102 in the LBMD is capable of performing the time difference of arrival calculation, e.g., a gateway 124 or an ICD 126, then the calculation is completed in that LBMD.

If no device in communication with the target IBD 128 is capable of performing the location calculations, such as if all of the IoT devices 102 in communication with the target IBD 128 are also IBDs 128, the IoT devices 102 may compose themselves to form an LBMD that includes five devices, three in communication with the target IBD 128, and another device capable of performing the calculations, such as a gateway 124 or an ICD 126. In this LBMD, the IoT devices 102 in communication with the target IBD 128 timestamp the communications and pass them on to the calculating device for the location determination. If the calculating device is a gateway 124, the results of the location communication may be sent to a server 104, for example, in response to a location query from the server 104 or an alert message from the IBD 128. If not, the LBMD may be composed of six elements, for example, including one of the gateways 124.

The IoT devices 102 are not limited to participating in an LBMD for a single target IBD 128, but may overlap in any number of LBMD to implement the functions described herein. For example, an IBD 128 may be in communications with two other IBDs 128 and a gateway 124. In this grouping of devices, three LBMDs may be formed, wherein each one of the three IBDs 128 is a target IBD 128 for each of the LBMDs. As a target IBD 128 moves through an environment, the IoT devices 102 may compose new LBMDs to monitor the target IBD 128.

Further, the LBMD for a target IBD 128 may be composed from any number of IoT devices 102 in the fog 120, depending on the needs. For example, an LBMD that is only communicating with a target IBD 128 may be formed using only other IBDs 128. If the target IBD 128 sends out an alert, a new LBMD may be composed that includes an ICD 126 or a gateway 124 to perform the location calculations from the timestamp of the alert messages. Further, the new LBMD may include an ICD 126 that has a charged IBD 128 for exchange with the current IBD 128.

The composability of the IoT devices 102 to form the LBMDs as needed may provide redundancy in communications as well as transparency to users. In this type of composable system, a user does not have to know any details of the communications infrastructure for the fog 120. When an IBD 128 needs replacing, the user receives an alert and is directed to the nearest ICD 126 for charging and replacement. The ICD 126 may have other features to assist in the location, such as flashing alert or an audible tone to assist the user in finding the ICDs 126.

As described herein, the gateways 124 may function as ICDs also, but the examples are not limited to this. In some examples, the gateways 124 may be merely routers that transfer network communications in the fog 120 to network communications in the cloud 100.

Figure 3:
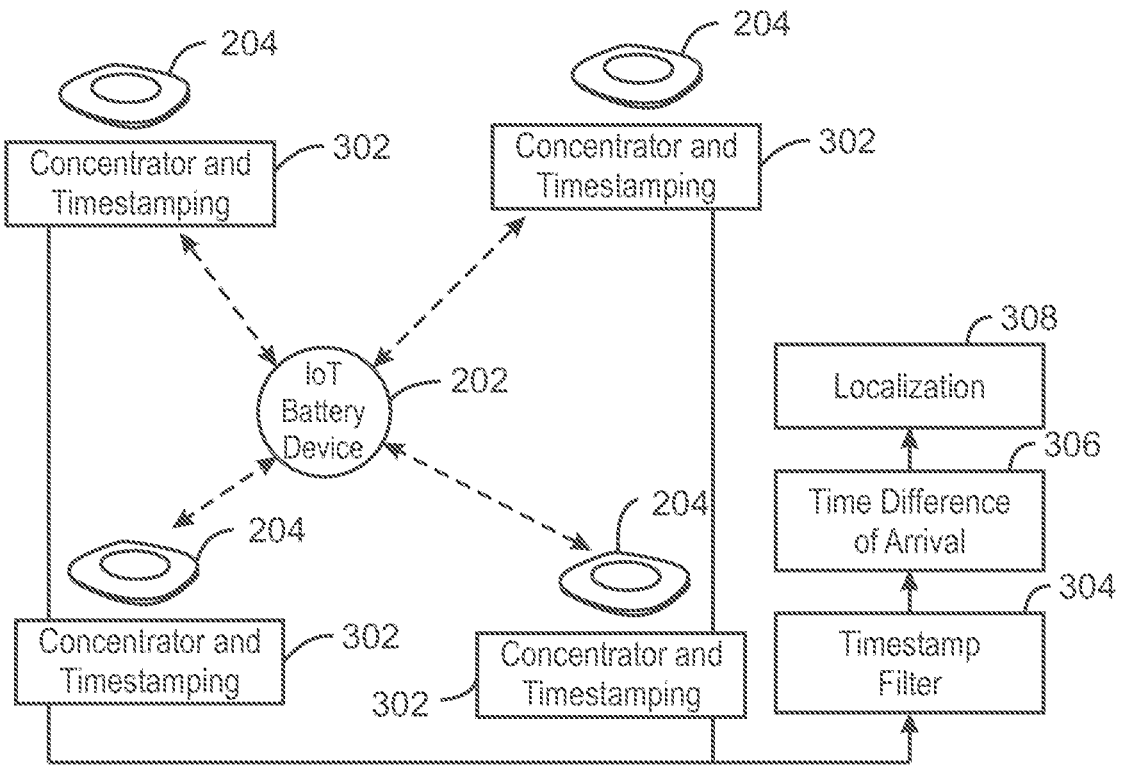
FIG. 3 is a schematic diagram of locating a position of an IBD from time of arrival of transmissions from the IBD at each of a number of ICDs.

FIG. 3 is a schematic diagram 300 of locating a position of an IBD 202 from time of arrival of transmissions from the IBD 202 at each of a number of ICDs 204. Like numbered items are as described with respect to FIG. 2. The modulation scheme used by the LPWA technology may be used to identity a specific data frame, and thus, may be used to precisely determine the Time-of-Arrival (ToA) of the radio signal at each of the ICDs 204. When the IBD 202 communicates with at least three ICDs 204, the ICDs 204 may calculate a location for the IBD 202. To implement this, the ICDs 204 perform a fine resolution time-stamping, e.g., to a sub-microsecond arrival time, of the received frame. All of the timestamps 302 may be collected by one of the ICDs 204 to perform the calculation, or the calculation may be run on each of the ICDs 204. A timestamp filter 304 can be run to identify the timestamps for a specific data communication from the IBDs 202. From this, a time difference of arrival algorithm 306 may be run to determine the arrival times or distance of the IBD 202 from each of the ICDs 204. Once this is performed, a localization algorithm 308 can determine the location, for example, by determining the point at which all three distances intersect.

Figure 4:
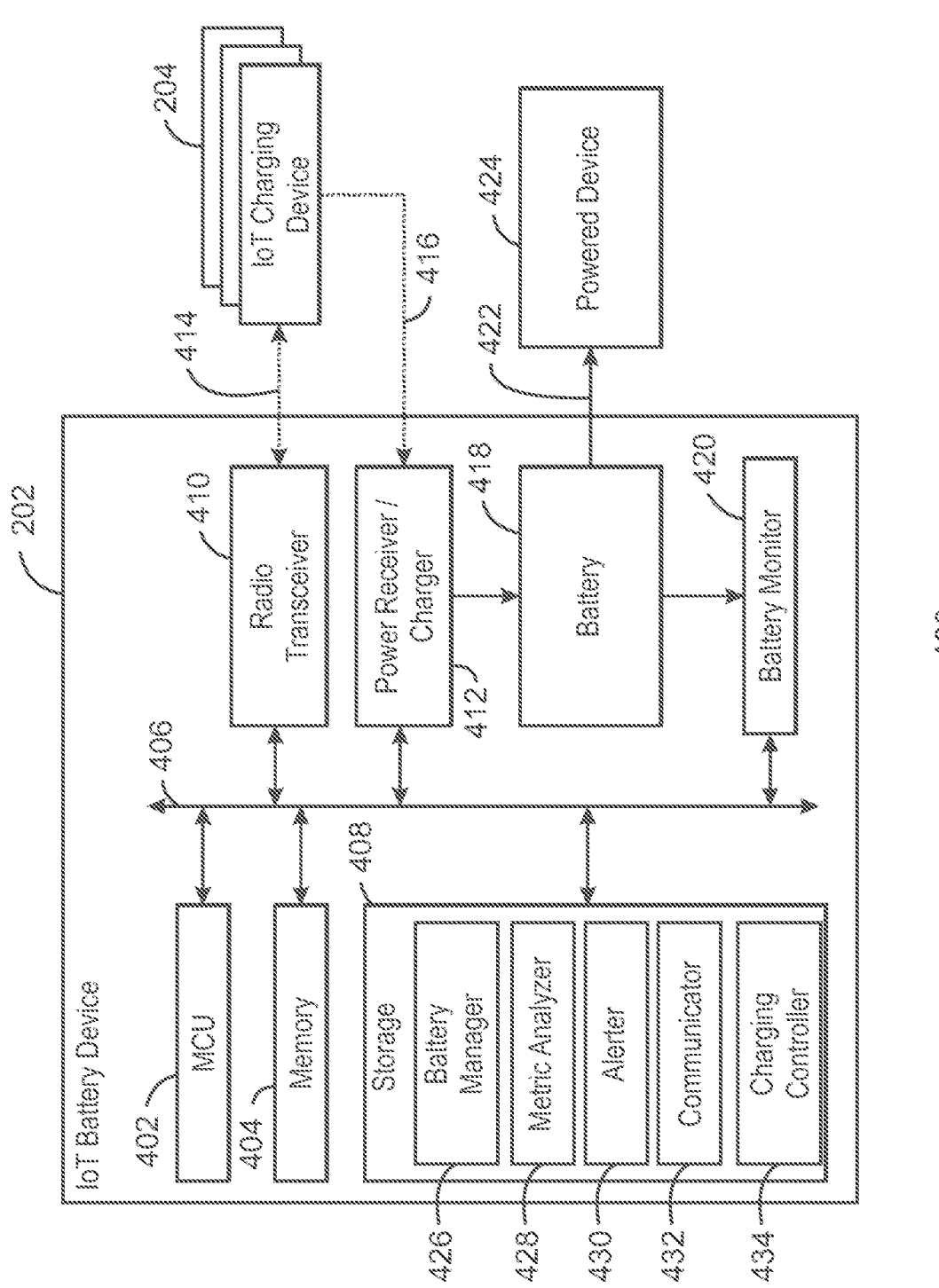
FIG. 4 is a block diagram of components that may be present in an example of an IBD.

FIG. 4 is a block diagram 400 of components that may be present in an example of an IBD 202. Like numbered items are as described with respect to FIG. 2. The IBD 202 may include an MCU 402, which may be a microcontroller unit, an ultra-low voltage processor, or other known low-power processing element. The MCU 402 may be a part of a system on a chip (SoC) in which the MCU 402 and other components are formed into a single integrated circuit, or a single package, such as the Edison or Galileo products available from Intel® Corporation of Santa Clara, CA.

As an example, the MCU 402 may include an Intel® Architecture Core™ based processor, such as a Quark™ D2000, MCS-96, MCU-1 or another such microcontroller unit available from Intel® Corporation, Santa Clara, CA. However, other low power processors may be used, such as from the PIC™ family of microcontrollers available from Microchip Technology of Chandler, Arizona, the MSP series of microcontrollers available from Texas Instruments, Inc. of Dallas, Texas, among many others.

The MCU 402 may communicate with a system memory 404 over a system bus 406. Any number of memory devices may be used to provide for a given amount of system memory. As the functions of the IBD 202 are generally directed to monitoring and communicating the status of the battery, simple memory devices such as 8 Kb, 16 Kb, or 32 Kb random access memory chips may be used. In some examples, the registers of the MCU 402, or memory that is directly incorporated into the MCU 402, may be used as the system memory 404.

To provide for persistent storage of information such as data, applications, operating systems and so forth, a mass storage 408 may also couple to the MCU 402 via the system bus 406. To enable a thinner and lighter system design the mass storage may be implemented as part of the MCU 402, or an SoC, or as a separate programmable flash memory chip of 128 Kb, 256 Kb, or larger, depending on the software size.

The system bus 406 may include any number of technologies, including for example, a proprietary bus included in an SoC. Other bus systems may be used instead of, or in addition to, an SoC bus, such as an I2C interface, an SPI interface, point to point interfaces, peripheral component interconnect express (PCIe), or any number of other technologies.

The system bus 406 may couple the MCU 402 to a radio transceiver 410 that is used to provide communications 414 with the ICDs 204. A power receiver/charger 412 may be coupled with the MCU 402, via the bus 406, to let the MCU 402 know that a power signal 416 has been received from an ICD 204. The power signal 416 may be a wireless signal that is received by a loop antennae in the IBD 202, or may be a physical connection to a charger in the ICD 204, for example, through contacts in a slot on the ICD 204 designed to hold the IBD 202. A battery charging circuit, such as an LTC4020 chip from Linear Technologies of Milpitas, CA, among others, may be included in the power receiver/charger. The specific charging circuits chosen depend on the size of the battery 418, and thus, the current required.

A battery monitor 420 may be included in the IBD 202 to track the state of charge (SoCh) of the battery 418, as well as the state of health (SoH) and the state of function (SoF). The battery monitor 420 may include a battery monitoring integrated circuit, such as an LTC4020 or an LTC2990 from Linear Technologies, an ADT7488A from ON Semiconductor of Phoenix Arizona, or an IC from the UCD90xxx family from Texas Instruments of Dallas, TX. The battery monitor 420 may communicate the information on the battery 418 to the MCU 402 over the bus 406. The battery monitor 420 may also include an analog-to-digital (ADC) convertor that allows the MCU 402 to directly monitor the voltage of the battery 418, or, with appropriate circuitry, the current flow from the battery 418. The battery monitor 420 may include a temperature monitor circuit to determine the temperature in the proximity of the battery 418.

The battery 418 may include any number of different types and sizes, depending on the application. For example, the battery 418 may include lead acid cells, lithium ion cells, nickel metal hydride cells, and the like. Further, the battery 418 may be a hybrid type, including both chemical storage cells and a supercapacitor. As described herein, the battery 418 may provide power 422 to an external powered device 424, as discussed herein. In some examples, the battery 418 may only be used by the IBD 202, for example, if the IBD 202 is used as a location monitor on an unpowered device, such as a gas cylinder, garbage receptacle, and the like. For larger power demands, such as when the battery 418 is providing power 422 to the powered device 424, a multi-cell battery, such as a lead acid battery, a nickel-metal hydride battery, a large scale lithium ion battery, or a hybrid battery, among others, may be used. For examples in which only the IBD 202 is being powered by the battery 418, a small lithium ion battery, a nickel-cadmium battery, or a supercapacitor, among others, may be used.

The powered device 424 may include sensors, such as traffic sensors, radar speed detectors, cameras, flow sensors, temperature sensors, motion sensors, wind speed sensors, pressure sensors, barometric pressure sensors, and the like. Further, the powered device 424 may include actuators, such as traffic lights, strobe lights, valve actuators, lock solenoids, audible sound generators, visual warning devices, and the like. The selection of the battery 418 may be determined by the power demand of the sensors and actuators used for the powered device 424.

The mass storage 408 may include a number of modules to direct the MCU 402 to perform the functions described herein. These may include, for example, a battery manager 426 that tracks the voltage, temperature, current, charge rate, discharge rate, and other parameters for the battery 418, from the battery monitor 420 and the power receiver/charger 412. A metric analyzer 428 compares the parameters for the battery 418 to preset thresholds to determine if the battery 418 is operating within normal limits, or if, for example, an alert needs to be sent by an alerter 430. The metric analyzer 428 may use filter functions, as described with respect to FIGS. 8A and 8B, to smooth transient variations in the parameters, reducing the risk of false alarms.

A communicator 432 implements the communications protocol and handles the communications through the radio transceiver, for example, using the LPWA protocol. The communicator 432 may send out the alerts from the alerter 430, and may also send out regular communications to inform the ICDs 204 of the current location of the IBD 202.

Once the IBD 202 has been placed in proximity to the ICD 204 for charging, a charging controller 434 may be used to instruct the power receiver/charger 412 to charge the battery 418. The charging controller 434 may also control other operations of the IBD 202 during charging, for example, disabling the radio transceiver 410 or decreasing the reporting increments, to allow for faster charging. Once the IBD 202 has been taken out of range of the ICD 204, stopping the flow of power to the power receiver/charger 412, the charging controller 434 may then enable the radio transceiver 410, and initiate communications with the ICDs 204.

Figure 5:
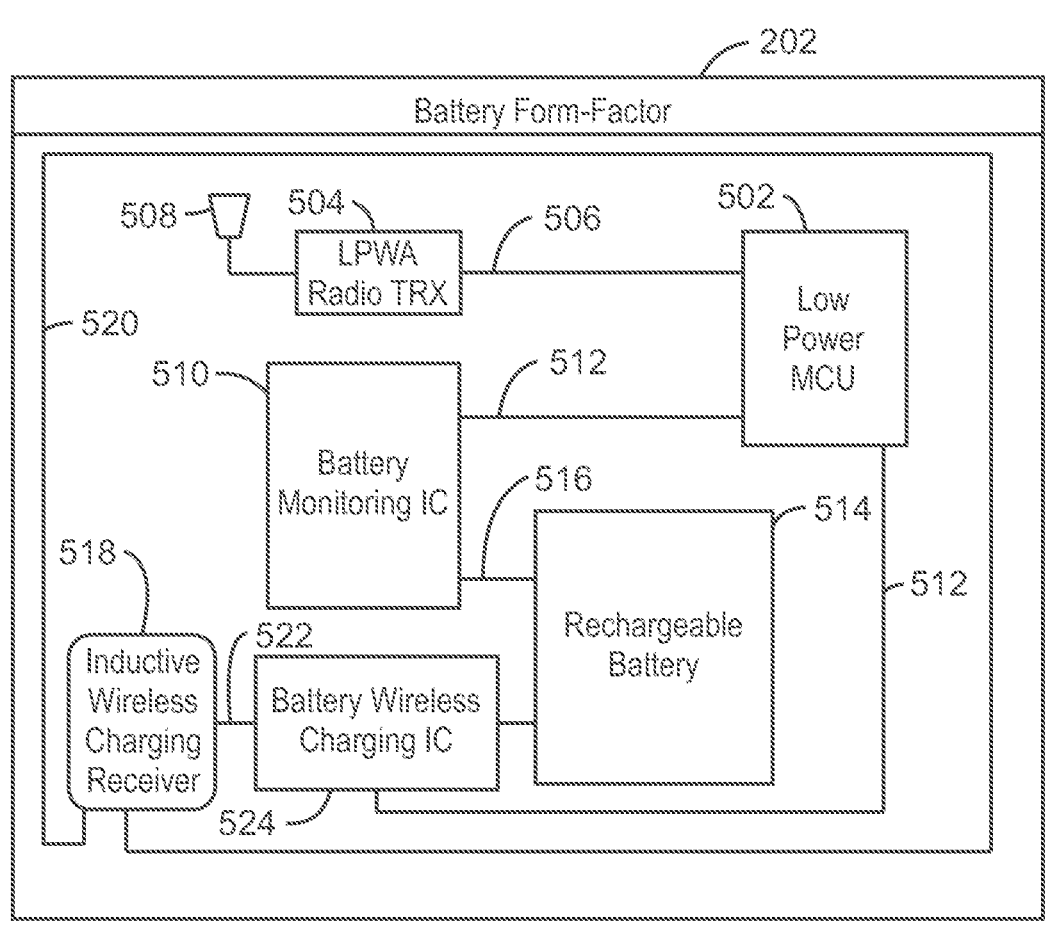
FIG. 5 is block diagram of an example of an IBD.

FIG. 5 is block diagram of an example 500 of an IBD 202. Like numbered items are as described with respect to FIGS. 2 and 4. In this example 502, a low power MCU 502, such as an Intel® Quark X3 is coupled to an LPWA radio transceiver 504 through a serial protocol interface (SPI) 506. The SPI 506 may directly couple to the MCU 502, for example, through a built in SPI module in the MCU 502. A radio antenna 508 is coupled to the LPWA radio transceiver 504.

A battery monitoring IC 510 may couple to the MCU 502 through an I2C interface 512. As for the SPI 506, an I2C module may be integrated into the MCU 502. In this example, the battery monitoring IC 510 is a low power IC capable of reading the battery temperature, current and voltage on a battery 514, for example, over lines 516.

An inductive wireless charging receiver 518 may receive current transmitted from an ICD via a loop antenna 520. The loop antenna 520 may be wrapped around the enclosure to allow placement in any number of positions proximate to the ICD, while still receiving current. The power 522 from the inductive wireless charging receiver 518 is provided to a battery wireless charging IC 524, which may alert the MCU 502 that current is detected over the I2C interface 512. The battery wireless charging IC 524 may automatically start the charging, or may wait until instructed to do so by the MCU 502 over the I2C interface 512.

FIG. 6 is a block diagram of an example 600 of components that may be present in an ICD 204. Like numbered items are as described with respect to FIGS. 1, 2, and 4. The ICD 204 may include any combinations of the components shown in the example 600. The components may be implemented as ICs, portions thereof, discrete electronic devices, or other modules, logic, hardware, software, firmware, or a combination thereof adapted in the ICD 204, or as components otherwise incorporated within a chassis of a larger system. The block diagram of FIG. 6 is intended to show a high level view of components of the ICD 204. However, some of the components shown may be omitted, additional components may be present, and different arrangement of the components shown may occur in other implementations.

The ICD 204 may include a processor 602, which may be a microprocessor, a multi-core processor, a multithreaded processor, an ultra-low voltage processor, an embedded processor, or other known processing element. The processor 602 may be a part of a system on a chip (SoC) in which the processor 602 and other components are formed into a single integrated circuit, or a single package, such as the Edison™ or Galileo™ SoC boards from Intel. As an example, the processor 602 may include an Intel® Architecture Core™ based processor, such as a Quark™, an Atorn™, an i3, an i5, an i7, or an MCU-class processors, or another such processor available from Intel® Corporation, Santa Clara, CA. However, other processors may be used, such as available from Advanced Micro Devices, Inc. (AMD) of Sunnyvale, CA, a MIPS-based design from MIPS Technologies, Inc. of Sunnyvale, CA, an ARM-based design licensed from ARM Holdings, Ltd. or customer thereof, or their licensees or adopters. The processors may include units such as an A5/A6 processor from Apple® Inc., a Snapdragon™ processor from Qualcomm® Technologies, Inc., or an OMAP™ processor from Texas Instruments, Inc.

The processor 602 may communicate with a system memory 604 over a bus 606. Any number of memory devices may be used to provide for a given amount of system memory. As examples, the memory can be random access memory (RAM) in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of any number of different package types such as single die package (SDP), dual die package (DDP) or quad die package (Q17P). These devices, in some embodiments, may be directly soldered onto a motherboard to provide a lower profile solution, while in other embodiments the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs. For example, a memory may be sized between 2 GB and 16 GB, and may be configured as a DDR3LM package or an LPDDR2 or LPDDR3 memory, which is soldered onto a motherboard via a ball grid array (BGA).

To provide for persistent storage of information such as data, applications, operating systems and so forth, a mass storage 608 may also couple to the processor 602 via the bus 606. To enable a thinner and lighter system design the mass storage 608 may be implemented via a solid state disk drive (SSDD). However, the mass storage 608 may be implemented using a micro hard disk drive (HDD) in some ICDs 204. Further, any number of new technologies may be used for the mass storage 608 in addition to, or instead of, the technologies described, such resistance change memories, phase change memories, holographic memories, or chemical memories, among others. For example, the ICD 204 may incorporate the 3D XPOINT memories from Intel® and Micron®.

The components may communicate over the bus 606. The bus 606 may include any number of technologies, including industry standard architecture (ISA), extended ISA (EISA), peripheral component interconnect (PCI), peripheral component interconnect extended (PCIx), PCI express (PCIe), or any number of other technologies. The bus 606 may be a proprietary bus, for example, used in a SoC based system. Other bus systems may be included, such as an I2C interface, an SPI interface, and point to point interfaces, among others.

The bus 606 may couple the processor 602 to a radio transceiver 610, for example, using an LPWA protocol for communications. In some examples, the radio transceiver 610 may be the same as the radio transceiver 410 used in an IBD 202. However, the radio transceiver 610 in the ICD 204 does not have to be the same, merely compatible. As the ICD 204 is likely to include a power supply 612 that is connected to grid power 614, an environmental power supply, or both, the radio transceiver 610 may be higher power unit than that used in the IBDs 202 to facilitate communications.

The ICD 204 may include a charger/power transmitter 616 to provide power signal 416 to an IBD 202, for example, by inductive coupling or through physical contacts. The charger/power transmitter 616 may alert the processor 602 when an IBD 202 is within charging range. In some examples, the processor 602 may instruct the charger/power transmitter 616 to start the charging, while in other examples, the charging may be automatically started. The charger/power transmitter 616 may also implement communications with the IBD 202, for example, through backscatter or through high frequency signals imposed on a lower frequency power signal, among others. The charging may be performed using the Airfuel standard promulgated by the Airfuel Alliance, the Qi wireless charging standard promulgated by the Wireless Power Consortium, the Rezence charging standard, promulgated by the Alliance for Wireless Power, among others.

A digital signal processor (DSP) 618 may be included to perform the location calculations. A graphics processing unit (GPU) or other high speed processing unit, may be used instead of, or in addition to, to DSP 618.

While not shown, various input/output (I/O) devices may be present within, or connected to, the ICD 204. For example, a display may be included to show information, such as IBD 202 locations and charge status. An input device, such as a touch screen or keypad may be included to accept input, for example, to enter a query to find a location of an IBD 202.

The ICD 204 can communicate with a cloud 100 through a network interface 620, for example, to exchange data with other ICDs 204. The network interface 620 may be a network interface card for an Ethernet connection, may include a wireless modules, or both. Any number of radios, configured for a particular wireless communication protocol, may be used as the network connections. For example, a WLAN unit may be used to implement Wi-Fi™ communications in accordance with the Institute of Electrical and Electronics Engineers (IEEE) 802.11 standard. In addition, wireless wide area communications, e.g., according to a cellular or other wireless wide area protocol, can occur via a WWAN unit. The ICD 204 is not limited to these types of radio transceivers, but may include any number of other radio communications equipment, such as transceivers compatible with the Bluetooth® standard as defined by the Bluetooth® special interest group, for example, the ICD 204 may communicate over a wireless personal area network (WPAN) according to the IEEE 802.15.4 standard, among others.

The mass storage 608 may include a number of modules to implement the data transfer functions described herein. These modules may include an IBD communicator 622 that controls communications with the IBD 202, for example, through the radio transceiver 610. The IBD communicator 622 may time stamp the packets or frames as they arrive. An intracharger communicator 624 may be used to send time-stamped packets to other ICDs 204 as well as other control information. A difference-of-arrival solver 626 may be used to determine the location, distance, or both of an IBD 202 from each of the ICDs 204. A localizer 628 may then determine the location of the IBD 202 from the arrival time of the same frame at each of the ICDs 204. A reporter 630 may be used to send alerts to a user, for example, through a server. The alerts may include the issue, e.g., an SoCh, SoH, or SoF alert, and a location for an IBD 202.

FIG. 7 is block diagram of an example 700 of an ICD 204. Like numbered items are as described with respect to FIGS. 2 and 6. The ICD 204 in this example 700 has a processor 702 from Intel®, such as an Atom®. The processor 702 may be coupled to a serial protocol interface (SPI) 704 over the bus 606. The SPI 704 may interface to the LPWA radio transceiver 706, which is coupled to an antenna 708.

An I2C interface 710 may be coupled to the processor 702 via the bus 606. The I2C interface 710 may couple to a battery wireless charging IC 712, which, in turn, couples to a coil 716 for transfer of power to an IBD.

The IBDs may periodically transmit their SoCh and internal temperature to the ICD 204. The ICD 204 has a WiFi interface 718 to obtain date from other ICDs, e.g., for calculating a location of an IBD, and to alert the user when a battery requires a charge and its current location. The temperature indication can also be used by the end-user to assess the battery condition. A display may be included on the ICD 204 to show the same information locally.

Figures 8A, 8B:
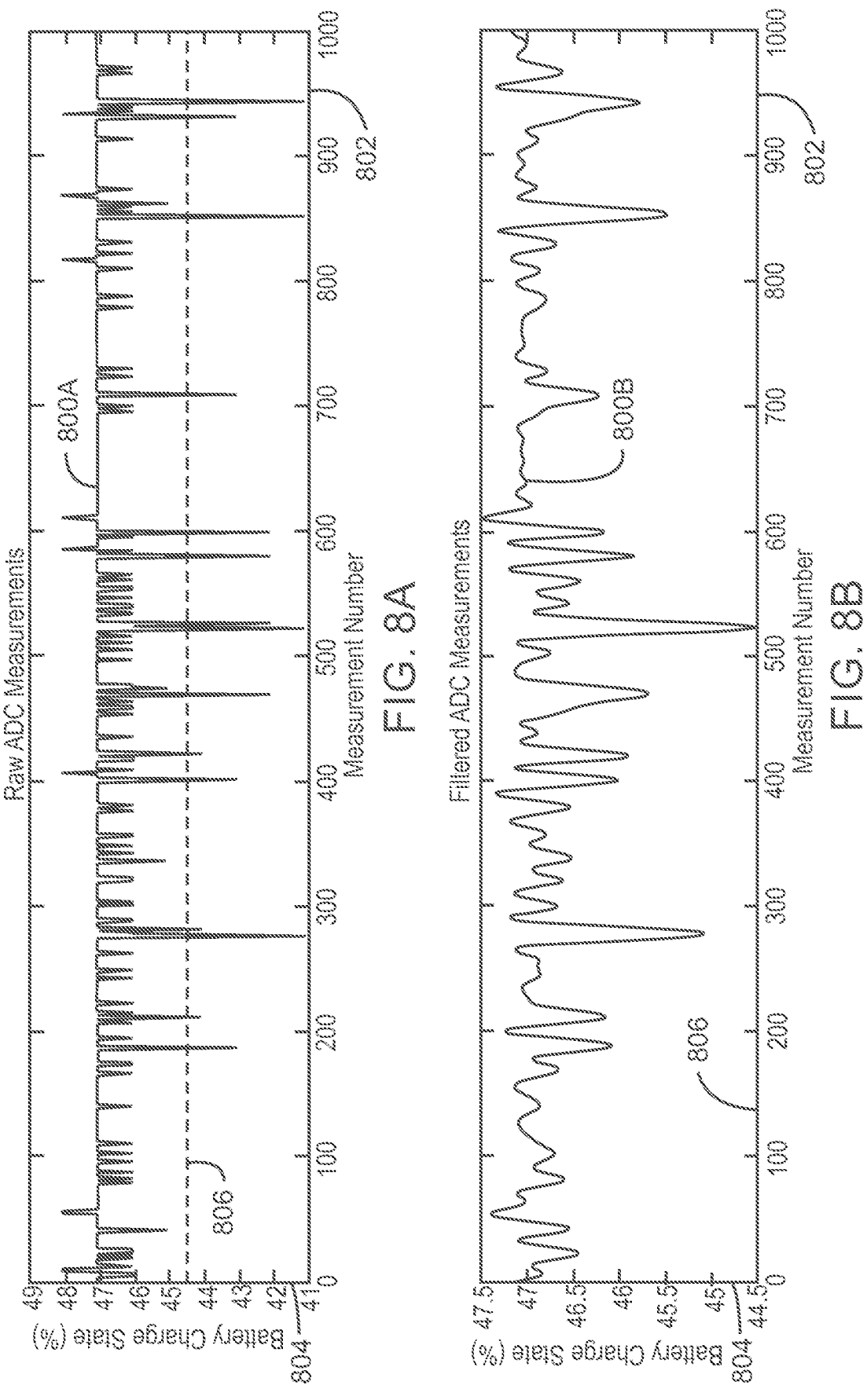
FIG. 8A is a plot of voltage state percentage versus measurement number.
FIG. 8B is a plot of the battery state percentage versus measurement number after a filtering function was applied.

FIG. 8A is a plot 800A of battery state percentage versus measurement number. The x-axis 802 represents a measurement number over time, while the y-axis 804 represents the battery charge state in %, for example, as determined from the voltage level on the battery. Battery-powered IoT devices that use radio transceivers may have bursts of current usage associated with the radio transmitter when it is dispatching data, which may result in transient reductions in voltage. As seen in FIG. 8A, the voltage fluctuates while, for example, when the radio transmitter is in use. This may lead to false low-battery detections. To reduce the effect of transient voltage dips, a low pass filter may be used to smooth out the fluctuations.

FIG. 8B is a plot 800B of the battery state percentage versus measurement number after a filtering function was applied. To generate the plot 800B, a 4-pole infinite impulse response (IIR) low pass filter was applied to the output of the ADC measurement data shown as plot 800A. In FIG. 8A, a line 806 is placed at 44.5% to highlight the differences. This line 806 is in FIG. 8B along the x-axis 802. While a number of the unfiltered values drop below the 44.5% value, none of the filtered values drop below that value.

Figure 9:
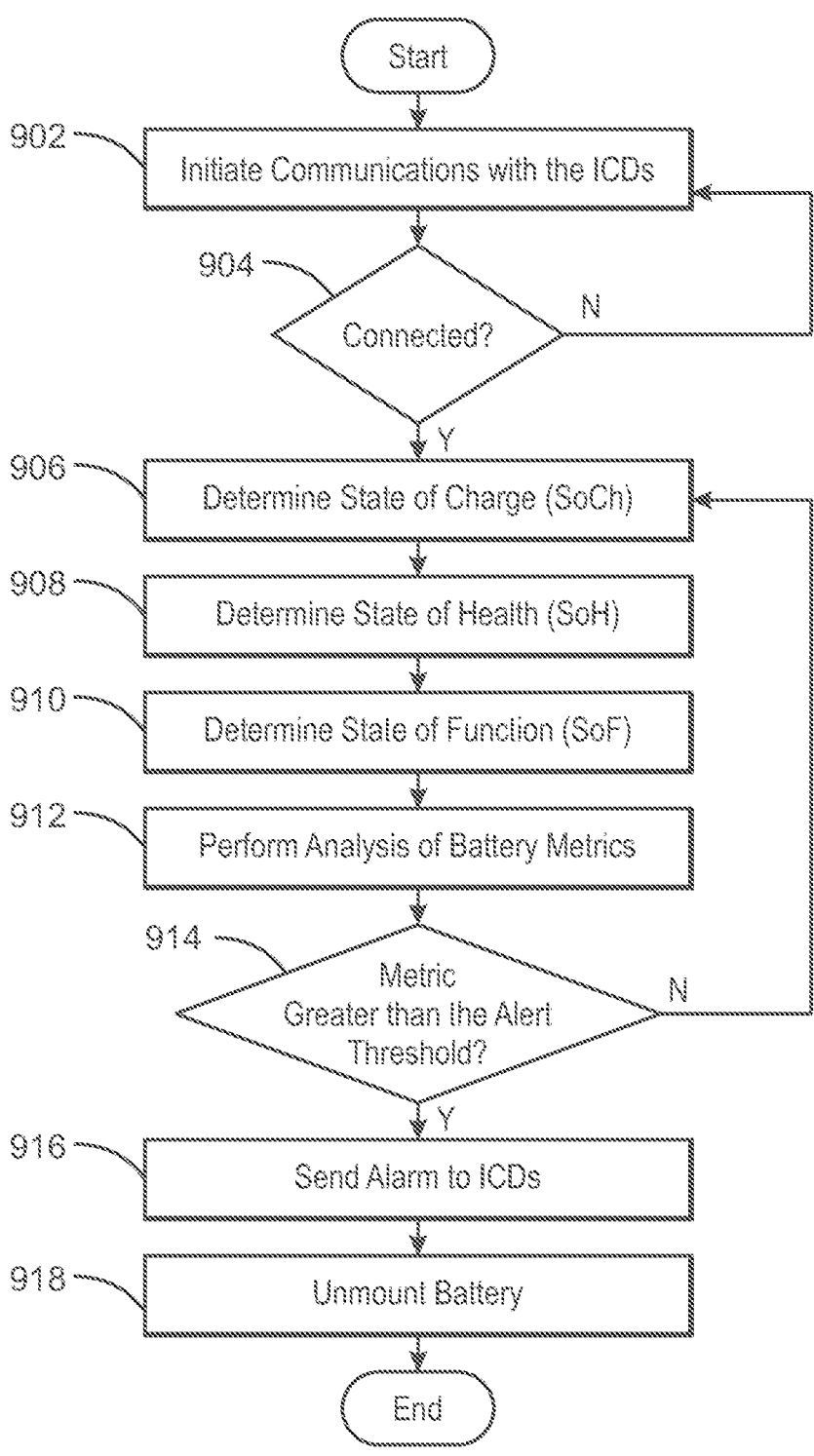
FIG. 9 is a process flow diagram of an example of a method for alerting that an IBD needs service.

FIG. 9 is a process flow diagram of an example of a method 900 for alerting that an IBD needs service. The method 900 begins at block 902, when the IBD initiates communications with the ICDs. This may take place when the IBD is inserted into a powered device, or when the IBD is removed from proximity of the ICD. The IBD requests an acknowledgment from the ICDs to confirm the connection. At block 904, a determination is made as to whether the connection was successful. If not, process flow returns to block 902 to try the connection again. Not all of the ICDs in a charging network need to confirm the connection. The ICDs may determine that the nearest ICD responds or the first ICD to respond may stop other ICDs in the network from responding, among other configurations.

If, at block 904, the connection is confirmed, the IBD joins the ICDs wireless network. The IBD then enters normal operation.

During normal operation, the internal circuits of the IBD check the state of charge (SoCh) on the battery at block 906. At block 908, the state of health (SoH) of the battery is determined. At block 910, the state of function (SoF) of the battery is determined. As described herein, the measurements for the SoCh, SoH, and SoF may be determined using a dedicated IC on the board or may be determined by an MCU using an ADC to measure the battery parameters. At block 912, an analysis of the metrics is performed.

At block 914, a determination is made as to whether any of the metrics exceeds an alert threshold. If not, process flow returns to block 906 to continue monitoring the battery. This may be performed at predetermined intervals, such as a second, five seconds, fifteen seconds, one minute, five minutes, fifteen minutes, or longer depending on the rate at which the battery is depleted. During the monitoring process, the information that the battery management IC measures may be periodically verified by the MCU.

If at block 914, it is determined that a metric has exceeded an alert threshold, at block 916 an alarm is sent to the ICDs. For example, if the battery voltage level or SoCh is less than the configurable threshold level, an alert is triggered by an alarm IRQ to the MCU. This MCU creates an alert message and then dispatches the alert message through the radio transceiver. An example of an alert message in JSON format is shown below. In this example, the message type denotes a battery alert, the payload includes a battery, or IBD, identifier, a timestamp in Unix epoch time format representing the time when the alert was generated, and a measured voltage level of the battery

```
{
    "msg_type":"battery-alert",
    "account_id":"battery0304",
    "sender_id":"0123CAFE",
    "timestamp":"1435034142",
    "data_source":[
        {
            "name":"voltage-alert",
            "metrICD":[
                {
                    "name":"voltage",
                    "value":"2.9"
                }
            ]
        }
    ]
}
```

The alert message may also include other information, such as values for the SoH and SoF parameters, the location of the IBD, and a location for a nearest charged IBD, among others. At block 918, the IBD is removed to be wirelessly recharged or the device, if small enough, is brought to the wireless charging station to recharge the battery.

Figure 10:
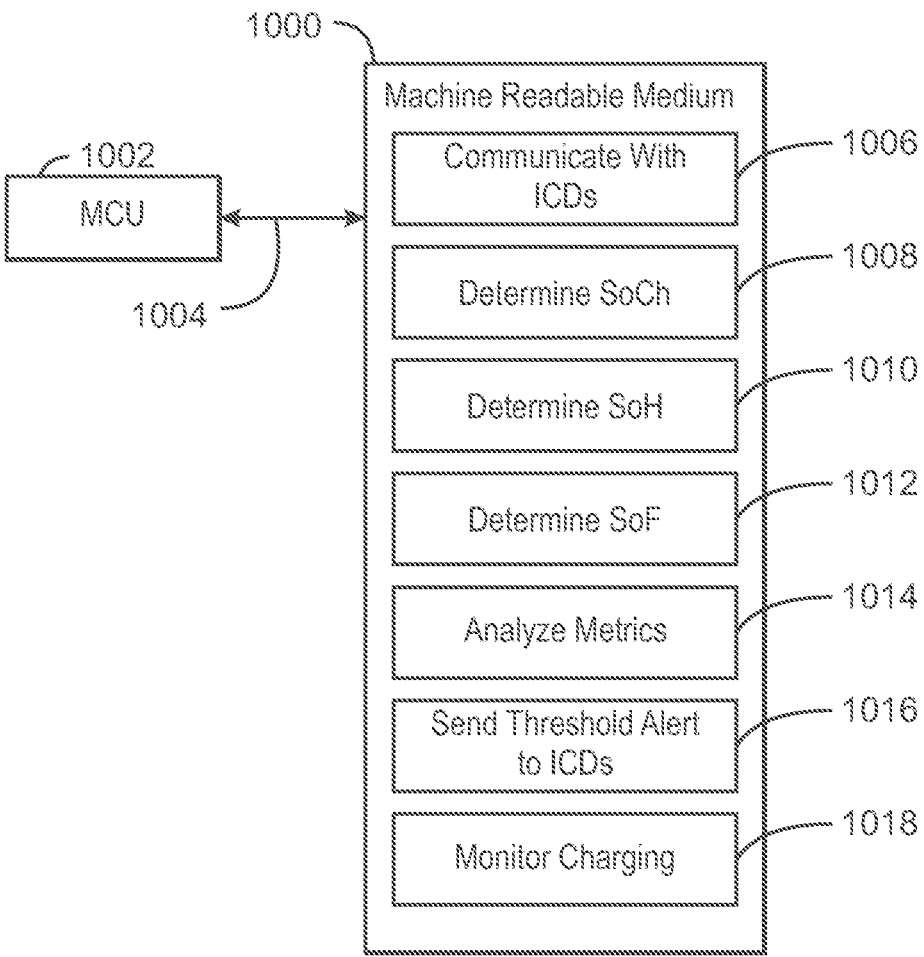
FIG. 10 is a block diagram of a non-transitory machine readable medium for directing an MCU to alert when a battery needs to be recharged in an IBD.

FIG. 10 is a block diagram of a non-transitory machine readable medium 1000 for directing an MCU 1002 to alert when a battery needs to be recharged in an IBD. The MCU 1002 can access the machine readable medium 1000 over a bus 1004, such as the proprietary bus in an SoC, among others. The MCU 1002 may be as described for the MCU of FIGS. 4 and 5. The non-transitory machine readable medium 1000 may include code 1006 to direct the MCU 1002 to communicate with gateways, such as ICDs. The communications may be configured to occur at regular intervals, such as every half hour, every hour, every few hours, and the like. Code may be included to direct the MCU 1002 to determine the SoCh 1008, the SoH 1010, and the SoF 1012 of the battery. This may be performed by the MCU 1002 directly, for example, using measurements from an ADC, or may be performed by obtaining some or all of the measurements from a battery monitoring IC. Code 1014 may be included to direct the MCU 1002 to analyze the metrics to determine if any have exceeded predetermined thresholds for the battery. Code 1016 may be included to direct the MCU 1002 to create and send an alert to the ICDs. Further, code 1018 may be included to direct the MCU 1002 to monitor the charging process, for example, turning off the radio transceiver during the charging process, determining if charging is complete, and the like.

Figure 11:
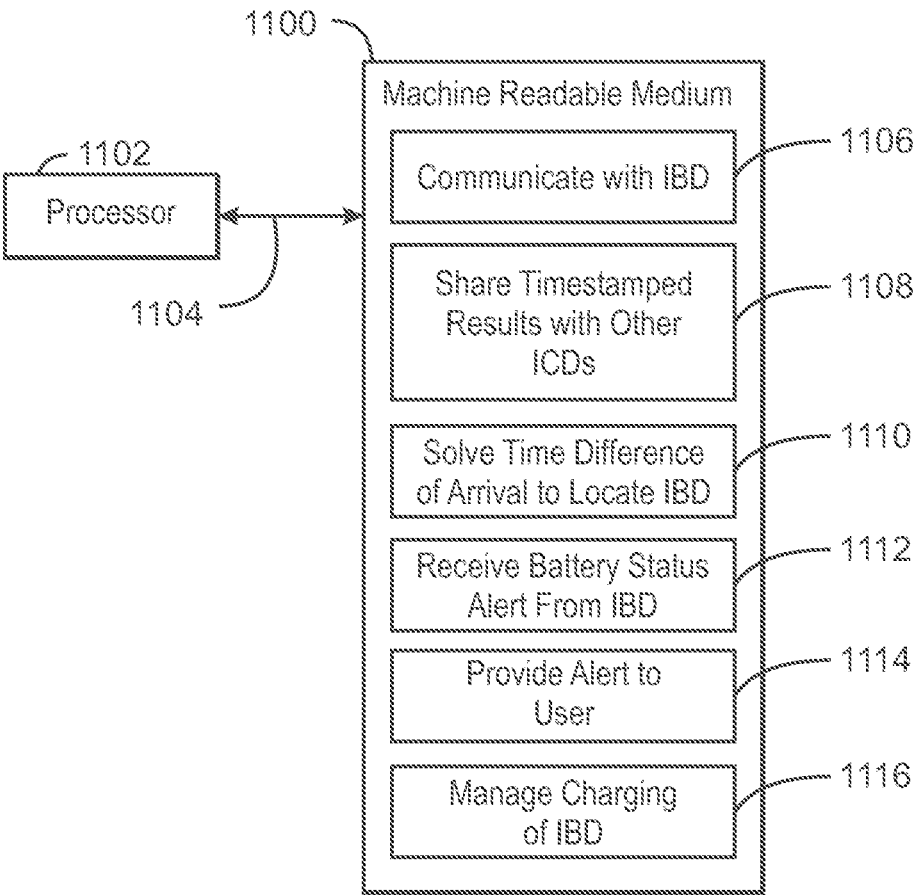
FIG. 11 is a block diagram of a non-transitory machine readable medium for directing a processor to locate and monitor an IBD.

FIG. 11 is a block diagram of a non-transitory machine readable medium 1100 for directing a processor 1102 to locate and monitor an IBD. The processor 1102 may access the machine readable medium 1100 over a bus 1104. The processor 1102 and bus 1104 may be as described with respect to FIGS. 6 and 7.

The non-transitory machine readable medium 1100 may include code 1106 to communicate with an IBD, for example, to receive alerts from the IBD, or to send confirmations of communications to the IBD. Code 1108 may be included to direct the processor to communicate with other ICDs, for example, to send time stamped communications received from the IBD.

Code 1110 may be included to direct the processor 1102 to solve a time difference of arrival algorithm for time-stamped frames received from the IBD by three or more ICDs. The code 1110 may direct a DSP or GPU in communication with the processor to implement the location algorithm. This may be used to locate the IBD at the intersection of the distance of the IBD from each of the ICDs.

Code 1112 may be included to direct the processor 1102 to receive an alert status from the IBD, and create an alert message. Further, code 1114 may be included to direct the processor to provide the alert to a user, for example, over a network connection to a cloud server.

Code 1116 may be included to direct the processor 1102 to manage charging of an IBD, for example, initiating the charging once an IBD has been detected in proximity of the charging loop. The code 1116 may also control the flow of current to the charging device, or monitor a specialty IC that controls the charging. The code 1116 may reduce the current once the IBD has been moved out of range, for example, leaving a small current to detect placement of IBDs in proximity to the ICD.

Examples

Example 1 provides an internet-of-things (IOT) battery device (IBD). The IBD includes a radio transceiver to communicate with an IoT charging device (ICD), a battery, and a battery monitor to determine a state of charge (SoCh) for the battery An alerter in included to send an alert message to the ICD, via the radio transceiver, to indicate that the SoCh is less than an alert threshold.

Example 2 includes the subject matter of example 1. In this example, the IBD includes a power receiver to wirelessly receive power from the ICD, and a charger to use the power to charge the battery.

Example 3 includes the subject matter of any of examples 1 to 2. In this example, the battery is to power a device external to the IBD.

Example 4 includes the subject matter of any of examples 1 to 3. In this example, the battery monitor includes an integrated circuit to monitor the SoCh.

Example 5 includes the subject matter of any of examples 1 to 4. In this example, the battery monitor includes an analog-to-digital (ADC) convertor to convert an output voltage of the battery to a digital value, and the IBD includes a battery manager to determine the SoCh from the digital value.

Example 6 includes the subject matter of any of examples 1 to 5. In this example, the IBD includes a case that is the same size and shape as a battery for a device.

Example 7 includes the subject matter of any of examples 1 to 6. In this example, the IBD includes a microcontroller unit (MCU).

Example 8 includes the subject matter of any of examples 1 to 7. In this example, the IBD includes a system on a chip (SoC).

Example 9 includes the subject matter of any of examples 1 to 8. In this example, the apparatus includes the ICD, which includes an ICD radio transceiver and a network interface. The ICD also includes an IBD communicator to communicate with an IBD through the ICD radio transceiver and an inter ICD communicator to exchange messages with other ICDs via the network interface. A localizer is included to determine a location of the IBD based, at least in part, on communications between the IBD and the ICD.

Example 10 includes the subject matter of any of examples 1 to 9. In this example, the ICD includes a DSP, wherein the DSP performs a time difference of arrival calculation on messages received from the IBD to determine a location for the IBD.

Example 11 includes the subject matter of any of examples 1 to 10. In this example, the messages exchanged with the other ICDs include frame identifiers and timestamp information for frames received at each of the other ICDs from the IBD, and the localizer determines the location of the IBD as an intersection of distances between the IBD and at least three ICDs.

Example 12 includes the subject matter of any of examples 1 to 11. In this example, the messages exchanged with the other ICDs include a distance from each ICD to the IBD.

Example 13 includes the subject matter of any of examples 1 to 12. In this example, the ICD includes a wireless power transmitter to charge an ICD.

Example 14 includes the subject matter of any of examples 1 to 13. In this example, the apparatus comprises a location and battery monitoring device (LBMD) that includes a plurality of internet of things (IoT) devices self-selected from a fog of IoT devices. The LMBD includes a target IoT battery device (IBD), and at least three other IoT devices in communication with the target IBD. Each of the three other IoT devices timestamps the communications received from the target IBD.

Example 15 includes the subject matter of any of examples 1 to 14. In this example, one of the plurality of IoT devices in the LBMD comprises an IoT charging device (ICD) that can use the timestamped communications from the target IBD to determine a location for the target IBD.

Example 16 includes the subject matter of any of examples 1 to 15. In this example, one of the plurality of IoT devices in the LBMD devices comprises a gateway device to pass communications on to a cloud.

Example 17 includes the subject matter of any of examples 1 to 16. In this example, the LBMD is reconfigured to add an IoT device for providing an additional function, wherein the additional function comprises a location calculation function, a cloud communication function, or both.

Example 18 includes the subject matter of any of examples 1 to 16. In this example, the LBMD is reconfigured to eliminate an IoT device providing a function that is no longer needed.

Example 19 provides a method for monitoring an Internet of Things (IoT) battery device (IBD). The method includes initiating communications from the IBD to an IoT charging device (ICD), determining a state of charge (SoCh) of a battery in the IBD, and analyzing the SoCh to determine if a threshold limit has been crossed. An alert message is sent to the ICD if the threshold has been crossed.

Example 20 includes the subject matter of examples 19. In this example, the method includes determining a state of health (SoH) of the battery, determining a state of function (SoF) of the battery, and analyzing the SoH and the SoF to determine if the SoH or the SoF or both crosses a relevant threshold limit. The alert message is sent to the ICD if the SoH or the SoF or both have crossed the relevant threshold limit.

Example 21 includes the subject matter of either of examples 19 or 20. In this example, the method includes exchanging messages between a plurality of ICDs, wherein the messages include timestamped communications from the IBD. The timestamped communications are filtered to determine a time of arrival of a communication from the IBD at each of the plurality of ICDs. A time difference of arrival calculation is performed on the communication to determining a location for the IBD.

Example 22 includes the subject matter of any of examples 19 to 21. In this example, the method includes transmitting a location of the IBD from the ICD to a user.

Example 23 includes the subject matter of any of examples 19 to 22. In this example, the method includes transmitting the alert message and the location of the IBD from the ICD to a user.

Example 24 includes the subject matter of any of examples 19 to 23. In this example, the method includes transmitting a location for a recharged IBD from the ICD to a user.

Example 25 includes the subject matter of any of examples 19 to 24. In this example, the method includes wirelessly transmitting power to an IBD that is proximate to an ICD.

Example 26 includes the subject matter of any of examples 19 to 25. In this example, the method includes detecting by the IBD that it is in range of the charging coils of the ICD, and powering off a radio transceiver in the IBD.

Example 27 includes the subject matter of any of examples 19 to 26. In this example, the method includes detecting by the IBD that is no longer in range of charging coils in the ICD, and initiating communications with the ICD via the radio transceiver.

Example 28 includes the subject matter of any of examples 19 to 27. In this example, the method includes detecting by the IBD that the ICD is no longer in range of charging coils in the ICD, and reducing power to a sensing level in the charging coils.

Example 29 includes the subject matter of any of examples 19 to 28. In this example, the method includes forming a virtual device from a plurality of IoT devices that are self-selected to perform functions, wherein the virtual device adds or removes IoT devices from the plurality of IoT devices as needed.

Example 30 provides instructions, which when executed by one or more processors, cause the one or more processors to perform any one of the methods of examples 19 to 29.

Example 32 provides an apparatus that comprises means for performing any one of the methods of examples 19 to 29.

Example 32 provides a non-transitory, machine readable medium including instructions to direct an MCU in an internet of things (IoT) battery device (IBD) to communicate with an ICD, determine a state of charge (SoCh) of a battery, and analyze the SoCh to determine if a threshold limit has been crossed. Instructions are also included to direct the MCU in the IBD to create an alert message including the SoCh, and send the alert message to an ICD.

Example 33 includes the subject matter of example 32. In this example, the non-transitory, machine readable medium includes instructions to direct the MCU in the IBD to determine a state of health (SoH), a state of function (SoF) or both for the battery create the alert message including the SoH, the SoF, or both, and send the alert message to the ICD.

Example 34 includes the subject matter of either of examples 32 or 33. In this example, the non-transitory, machine readable medium includes instructions to direct the MCU in the IBD to monitor the charging of the battery.

Example 35 provides code to direct a processor in an internet of things (IoT) charging device (ICD) to communicate with an IoT battery device (IBD), exchange time-stamped communications from the IBD with other ICDs, filter the timestamped communications to identify a communication received by at least three ICDs, and solve a time difference of arrival on the communication received by the at least three ICDs to locate the IBD.

Example 36 includes the subject matter of example 35. In this example, the non-transitory machine readable medium includes code to direct the processor in the ICD to receive a battery status alert from the IBD, and provide the alert to user.

Example 37 includes the subject matter of either of examples 35 or 36. In this example, the non-transitory machine readable medium includes code to direct the processor in the ICD to manage power transmission to an IBD to charge the battery.

Example 38 provides an internet-of-things (IoT) battery device (IBD). The IBD includes a radio transceiver to communicate with an IoT charging device (ICD), a battery, a battery monitor to determine a state of charge (SoCh) for the battery, and a means to send an alert message to indicate that the SoCh is less than a relevant alert threshold.

Example 39 includes the subject matter of example 38. In this example, the apparatus includes the ICD, which includes an ICD radio transceiver, a network interface, an IBD communicator to communicate with an IBD through the ICD radio transceiver, an inter ICD communicator to exchange messages with other ICDs via the network interface, and a means to determine a location of the IBD based.

Example 40 includes the subject matter of either of examples 38 or 39. In this example, the apparatus includes a means to wirelessly charge the IBD.

Example 41 includes the subject matter of any of examples 38 to 40. In this example, the apparatus includes a means to monitor the SoCh.

Example 42 includes the subject matter of any of examples 38 to 41. In this example, the apparatus includes a means to perform a time difference of arrival calculation to determine a location for the IBD.

Example 43 provides a location and battery monitoring device (LBMD) that includes a plurality of internet of things (IoT) devices self-selected from a fog of IoT devices. The LMBD includes a target IoT battery device (IBD), and at least three other IoT devices in communication with the target IBD. Each of the three other IoT devices timestamps the communications received from the target IBD.

Example 44 includes the subject matter of example 43. In this example, one of the plurality of IoT devices comprises an IoT charging device (ICD) that can use the timestamped communications from the target IBD to determine a location for the target IBD.

Example 45 includes the subject matter of either of examples 43 or 44. In this example, one of the plurality of IoT devices comprises a gateway device to pass communications on to a cloud.

Example 46 includes the subject matter of any of examples 43 to 45. In this example, the LBMD is reconfigured to add an IoT device for providing an additional function, wherein the additional function comprises a location calculation function, a cloud communication function, or both.

Example 47 includes the subject matter of any of examples 43 to 46. In this example, the LBMD is reconfigured to eliminate an IoT device providing a function that is no longer needed.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the techniques. The various appearances of "an embodiment", "one embodiment", or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

The techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the techniques.

What is claimed is:

1. A system, comprising:
a plurality of internet-of-things (IoT) charging devices (ICDs); and
a vehicle including an IoT battery device (IBD), the IBD comprising:
a battery; and
at least one processor configured to:
determine a state of charge (SoCh) for the battery, the SoCh being a value that represents a remaining capacity of the battery;
alert a user when the SoCh crosses an alert threshold;
communicate, in response to a user input, via a wide area network (WAN) with at least one ICD of the plurality of ICDs to receive status information and location information of one or more ICDs of the plurality of ICDs; and
based at least in part on the status information and the location information, provide directions to the user to the one or more ICDs of the plurality of ICDs, wherein the one or more ICDs of the plurality of ICDs are capable of charging the IBD.

2. The system of claim 1, wherein the status information indicates whether the one or more ICDs are coupled with another IBD.

3. The system of claim 2, wherein the status information indicates whether one ICD of the one or more ICDs is coupled with a fully charged IBD.

4. The system of claim 1, wherein the SoCh is determined to cross the alert threshold when a filtered output of a measured voltage of the battery crosses the alert threshold.

5. The system of claim 1, wherein the directions include a designation of a nearest ICD capable of charging the IBD.

6. The system of claim 1, wherein the location information comprises distances from the vehicle to each of the one or more ICDs of the plurality of ICDs.

7. An apparatus, comprising:
an internet-of-things (IoT) battery device (IBD), the IBD comprising:
a battery; and
a processor configured to:
determine a state of charge (SoCh) for the battery, the SoCh being a value that represents a remaining capacity of the battery;
alert a user when the SoCh crosses an alert threshold;
communicate, in response to user input, via a wide area network (WAN) with at least one IoT charging device (ICD) to receive status information and location information of one or more ICDs; and
based at least on the status information and the location information, provide directions to the user to the one or more ICDs, which are capable of charging the IBD.

8. The apparatus of claim 7, wherein the status information indicates whether the one or more ICDs are coupled with another IBD.

9. The apparatus of claim 8, wherein the status information indicates whether one ICD of the one or more ICDs is coupled with a fully charged IBD.

10. The apparatus of claim 7, wherein the SoCh is determined to cross the alert threshold when a filtered output of a measured voltage of the battery crosses the alert threshold.

11. The apparatus of claim 7, wherein the directions include a designation of a nearest ICD capable of charging the IBD.

12. The apparatus of claim 7, wherein the location information comprises distances from the IBD to each of the one or more ICDs.

13. The apparatus of claim 7, wherein the apparatus comprises a vehicle.

14. An apparatus, comprising:
an internet-of-things (IoT) charging device (ICD), the ICD comprising:
a charger configured to provide power to one or more IoT battery devices (IBDs); and
a processor configured to:
receive a notification, via a wide area network (WAN), indicating a state of charge (SoCh) of a battery of an IBD, the SoCh being a value that represents a remaining capacity of the battery; and
communicate via the WAN with the IBD to provide status information and location information of the ICD, wherein the location information would, in part, allow a vehicle comprising the IBD to navigate to the ICD.

15. The apparatus of claim 14, wherein the status information indicates whether the ICD is coupled with another IBD.

16. The apparatus of claim 14, wherein the status information indicates that the ICD is coupled with a fully charged IBD.

17. The apparatus of claim 14, wherein the ICD communicates status and location information for one or more other ICDs.

18. The apparatus of claim 14, wherein the status and location information designates whether the ICD is a nearest ICD capable of charging the IBD among a plurality of ICDs configured to communicate via the WAN.

19. The apparatus of claim 14, wherein the location information comprises distances from the ICD to the IBD.

20. The apparatus of claim 17, wherein the location information for the one or more other ICDs comprises distances of each of the one or more other ICDs to the IBD.

* * * * *